United States Patent
Moon et al.

(10) Patent No.: US 8,741,671 B2
(45) Date of Patent: Jun. 3, 2014

(54) METHOD FOR MANUFACTURING LIGHT EMITTING DEVICE HAVING AN ACTIVE LAYER FORMED OVER A GA-FACE

(75) Inventors: JiHyung Moon, Seoul (KR); HwanHee Jeong, Seoul (KR); KwangKi Choi, Seoul (KR); JuneO Song, Seoul (KR); SangYoul Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/280,600

(22) Filed: Oct. 25, 2011

(65) Prior Publication Data

US 2012/0107979 A1    May 3, 2012

(30) Foreign Application Priority Data

Oct. 29, 2010   (KR) .................. 10-2010-0107135

(51) Int. Cl.
 *H01L 33/58* (2010.01)
 *H01L 33/26* (2010.01)

(52) U.S. Cl.
 USPC  438/29; 257/76; 257/E33.006; 257/E33.013; 257/E33.074

(58) Field of Classification Search
 USPC ............. 257/76, E33.006, E33.013, E33.074; 438/29, 46, 42, 458
 See application file for complete search history.

(56) References Cited

U.S. PATENT DOCUMENTS

| | | | | |
|---|---|---|---|---|
| 6,521,511 | B1 * | 2/2003 | Inoue et al. | 438/458 |
| 6,946,370 | B2 * | 9/2005 | Koike et al. | 438/479 |
| 7,189,631 | B2 * | 3/2007 | Yamazaki et al. | 438/458 |
| 7,253,499 | B2 * | 8/2007 | Shibata | 257/615 |
| 7,399,693 | B2 * | 7/2008 | Sekiguchi et al. | 438/607 |
| 2008/0248629 | A1 * | 10/2008 | Yamazaki | 438/458 |
| 2009/0081821 | A1 * | 3/2009 | Aihara | 438/42 |
| 2009/0174014 | A1 * | 7/2009 | Kunze et al. | 257/415 |
| 2010/0109019 | A1 * | 5/2010 | Yonehara | 257/76 |

* cited by examiner

*Primary Examiner* — Lex Malsawma
*Assistant Examiner* — Sheng Zhu
(74) *Attorney, Agent, or Firm* — Ked & Associates, LLP

(57) ABSTRACT

A method for manufacturing a light emitting device is disclosed. The disclosed method includes forming a first-conductivity-type semiconductor layer over a first substrate such that a first surface of the first-conductivity-type semiconductor layer is adjacent to the first substrate, disposing a second substrate on a second surface of the first-conductivity-type semiconductor layer opposite the first surface, separating the first substrate, disposing a third substrate on the first surface, separating the second substrate, and forming an active layer and a second-conductivity-type semiconductor layer over the second surface. In accordance with the method, it is possible to use a relatively inexpensive substrate. As a semiconductor layer is formed over a Ga-face of a gallium nitride semiconductor layer, an increase in light emission efficiency is achieved.

16 Claims, 13 Drawing Sheets

US 8,741,671 B2

METHOD FOR MANUFACTURING LIGHT EMITTING DEVICE HAVING AN ACTIVE LAYER FORMED OVER A GA-FACE

CROSS-REFERENCE TO RELATED APPLICATION

This application claims the priority benefit of Korean Patent Application No. 10-2010-0107135, filed on Oct. 29, 2010 in the Korean Intellectual Property Office, the disclosure of which is incorporated herein by reference.

BACKGROUND

1. Field

Embodiments relate to a method for manufacturing a light emitting device.

2. Description of the Related Art

A light emitting diode (LED) is a device for converting an electrical signal in the form of infrared light, visible light, or other light. Currently, such an LED is used in domestic electronic appliances, remote controllers, advertising display panels, displayers, various automation appliances, etc, and the application range thereof is gradually expanding.

Meanwhile, generally, a semiconductor is grown over a substrate through a semiconductor process. The structure of the substrate determines the kind and structure of a semiconductor, which may be grown over the substrate. A sapphire ($Al_2O_3$) substrate or an SiC substrate is commercially available. The sapphire substrate has drawbacks of great lattice misalignment, electrical non-conductivity, and low thermal conductivity. When a thin film made of gallium nitride (GaN) is coupled to the sapphire substrate, dislocation is propagated into the GaN thin film due to great lattice misalignment of the sapphire substrate, thereby degrading the device characteristics.

SUMMARY

Embodiments provide a method for manufacturing a light emitting device.

In one embodiment, a method for manufacturing a light emitting device includes forming a first-conductivity-type semiconductor layer over a first substrate such that a first surface of the first-conductivity-type semiconductor layer is adjacent to the first substrate, disposing a second substrate on a second surface of the first-conductivity-type semiconductor layer opposite the first surface, separating the first substrate, disposing a third substrate on the first surface, separating the second substrate, and forming an active layer and a second-conductivity-type semiconductor layer over the second surface.

The method may further include further growing the first-conductivity-type semiconductor layer over the second surface, to increase a thickness of the first-conductivity-type semiconductor layer.

The first substrate may include one of sapphire ($Al_2O_3$), GaN, and SiC.

The second substrate may include at least one of glass and silicon (Si).

The third substrate may include at least one of glass and silicon (Si).

The method may further include forming a bonding layer between the second surface and the second substrate.

The bonding layer may include at least one of $SiO_2$, gold-tin (AuSn), indium tin oxide (ITO), GaN, InGaN, ZnO, InN, $In_2O_3$, $SnO_2$, $Si_3N_4$, BeMgO, and MgZnO.

The first substrate may be separated from the first-conductivity-type semiconductor layer, using at least one of a chemical-mechanical polishing method, an electrical-chemical etching method, and a wet etching method using a liquid etchant.

The second substrate may be separated from the first-conductivity-type semiconductor layer, using at least one of a chemical-mechanical polishing method, an electrical-chemical etching method, and a wet etching method using a liquid etchant.

The bonding layer may be coupled to the second substrate, using at least one of Au—Sn eutectic bonding, metallic bonding, spin-on-glass (SOG) bonding, fusion bonding, polymer bonding, anodic bonding, and diffusion bonding.

The third substrate may be coupled to the first-conductivity-type semiconductor layer, using at least one of Au—Sn eutectic bonding, metallic bonding, spin-on-glass (SOG) bonding, fusion bonding, polymer bonding, anodic bonding, and diffusion bonding.

The first-conductivity-type semiconductor layer may include GaN.

The second surface, which is exposed after the separation of the second substrate, may be a Ga-face.

The method may further include forming irregularities on the first surface, which is exposed after the separation of the first substrate.

The method may further include forming an undoped semiconductor layer over the first-conductivity-type semiconductor layer.

The method may further include forming a contact layer over the first surface, which is exposed after the separation of the first substrate.

The contact layer may include at least one of $SiO_2$, gold-tin (AuSn), indium tin oxide (ITO), GaN, InGaN, ZnO, InN, $In_2O_3$, $SnO_2$, $Si_3N_4$, BeMgO, and MgZnO.

The method may further include forming a buffer layer between the first substrate and the first-conductivity-type semiconductor layer.

In another embodiment, a light emitting device package includes a light emitting device manufactured using the light emitting device package manufacturing method.

In another embodiment, a backlight unit includes a light emitting device manufactured using the light emitting device package manufacturing method.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Figure 1:
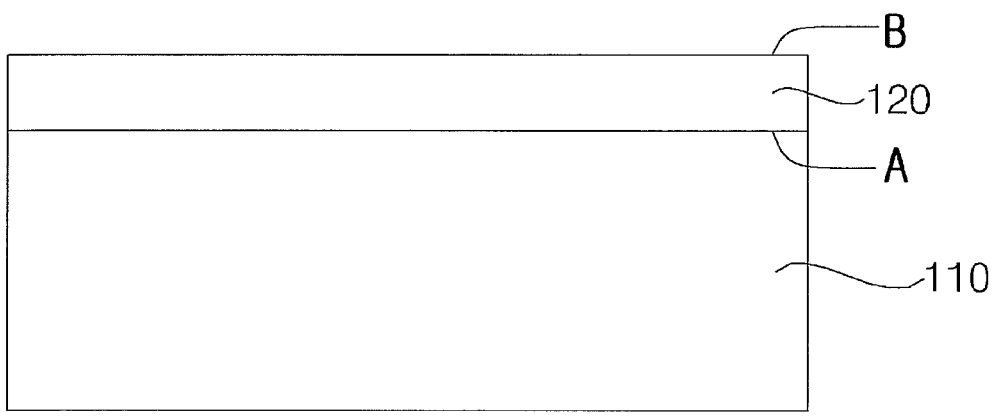
FIGS. 1 to 7 are views illustrating a method for manufacturing a light emitting device in accordance with an exemplary embodiment.

In the following description of the embodiments, it will be understood that, when an element such as a layer (film), region, pattern, or structure is referred to as being "on" or "under" another element, it can be "directly" on or under another element or can be "indirectly" formed such that an intervening element is also present. Also, terms such as "on" or "under" should be understood on the basis of the drawings.

It will be understood that when an element such as a layer, region or substrate is referred to as being "on" another element, it can be directly on the other element or intervening elements may also be present. It will also be understood that if part of an element, such as a surface, is referred to as "inner," it is closer to the inside of the device than other parts of the element.

In the meantime, although terms including an ordinal number, such as first or second, may be used to describe a variety of constituent elements, the constituent elements are not limited to the terms, and the terms are used only for the purpose of discriminating one constituent element from other constituent elements.

In the drawings, the thickness or size of each layer is exaggerated, omitted, or schematically illustrated for convenience of description and clarity. Also, the size or area of each constituent element does not entirely reflect the actual size thereof.

Hereinafter, embodiments will be described in more detail with reference to the accompanying drawings, namely, FIGS. 1 to 7.

FIGS. 1 to 7 are views illustrating a method for manufacturing a light emitting device in accordance with an exemplary embodiment.

Referring to FIG. 1, a first-conductivity-type semiconductor layer 120 may be formed over a first substrate 110.

The first substrate 110 may be made of a material comprising at least one of sapphire ($Al_2O_3$), GaN, SiC, ZnO, Si, GaP, InP, and GaAs. The first substrate 110 may have a single-layer structure. Alternatively, the first substrate 110 may have a double-layer structure or a multilayer structure having three or more layers. A buffer layer (not shown) may be formed over the first substrate 110, to reduce lattice misalignment between the first substrate 110 and the first-conductivity-type semiconductor layer 120 while enabling easy growth of semiconductor layers.

The buffer layer (not shown) is formed using a metal material exhibiting excellent bonding force to the material of the under layer disposed beneath the buffer layer. The metal material, which exhibits excellent bonding force, to be used for the buffer layer, may be at least one of indium (In), tin (Sn), silver (Ag), niobium (Nb), nickel (Ni), aluminum (Au), and copper (Cu). The buffer layer may also be made of a combination of Group-III and Group-V elements or one of GaN, InN, AlN, InGaN, AlGaN, InAlGaN, and AlInN. The buffer layer may be doped with a dopant.

The buffer layer may include AlN and GaN, to have an AlInN/GaN laminate structure, an $In_xGa_{1-x}N/GaN$ laminate structure, an $Al_xIn_yGa_{1-x-y}N/In_xGa_{1-x}N/GaN$ laminate structure, etc.

An undoped semiconductor layer (not shown) may be formed over the first substrate 110 or the buffer layer (not shown).

For example, it may be possible to form an undoped semiconductor layer to a predetermined thickness by supplying $NH_3$ and tri-methyl gallium (TMGa) to the buffer layer (not shown) at a growth temperature of 1,500° C.

Both the buffer layer (not shown) and the undoped semiconductor layer are formed over the first substrate 110. Alternatively, only one of the buffer layer and undoped semiconductor layer may be formed. Furthermore, the buffer layer and undoped semiconductor layer may be formed in a separate state over the first substrate 100. Of course, the present disclosure is not limited to the above-described structures.

The first substrate 110 may be a substrate made of a material different from that of a semiconductor layer formed thereon, for example, a sapphire ($Al_2O_3$) substrate, or a substrate made of the same material as the semiconductor layer, for example, a GaN substrate. As described above, the first substrate 110 may be made of a material comprising at least one of ZnO, Si, GaP, InP, and GaAs. Also, the first substrate 110 may be an SiC substrate exhibiting high thermal conductivity, as compared to the sapphire ($Al_2O_3$) substrate. Of course, the first substrate 110 is not limited to the above-described substrates or materials.

Although not shown, a layer or pattern, which is made of a Group-II or Group-VI compound semiconductor, for example, at least one of a ZnO layer (not shown), a buffer layer (not shown), and an undoped semiconductor layer (not shown) may be formed. The buffer layer reduces a lattice constant difference between the first substrate 110 and the semiconductor layer formed on the first substrate 110. The undoped semiconductor layer may be made of an undoped Ga-based semiconductor.

Meanwhile, the first substrate 110 may be made of sapphire ($Al_2O_3$), as described above. Since sapphire has a high melting point of about 2,050° C., it is suitable for use as a substrate, on which a thin film made of gallium nitride (GaN) is to be deposited at high temperature. Also, sapphire well endures various wet etching conditions because it is not easily etched by acid or alkali. In addition, sapphire is relatively inexpensive.

The first-conductivity-type semiconductor layer 120 formed over the first substrate 110 may be implemented by, for example, an n-type semiconductor layer. The n-type semiconductor layer may be made of a Ga-based compound semiconductor such as GaN, AlGaN, or InGaN. In this case, the first-conductivity-type semiconductor layer 120 may be formed by supplying silane ($SiH_4$) gas containing an n-type dopant such as $NH_3$, TMGa, or Si. The first-conductivity-type semiconductor layer 120 may have a multilayer structure. The first-conductivity-type semiconductor layer 120 may further include a clad layer.

When the first-conductivity-type semiconductor layer 120 is an n-type semiconductor layer, the n-type semiconductor layer may be made of a semiconductor material having a formula of $In_xAl_yGa_{1-x-y}N$ ($0 \leq x \leq 1$, $0 \leq y \leq 1$, and $0 \leq x+y \leq 1$), for example, GaN, AlN, AlGaN, InGaN, InN, InAlGaN, or AlInN. The n-type semiconductor layer may be doped with an n-type dopant such as Si, Ge, C or Sn. A process for separating the first substrate 110 in accordance with an embodiment will be described later.

Figure 2:
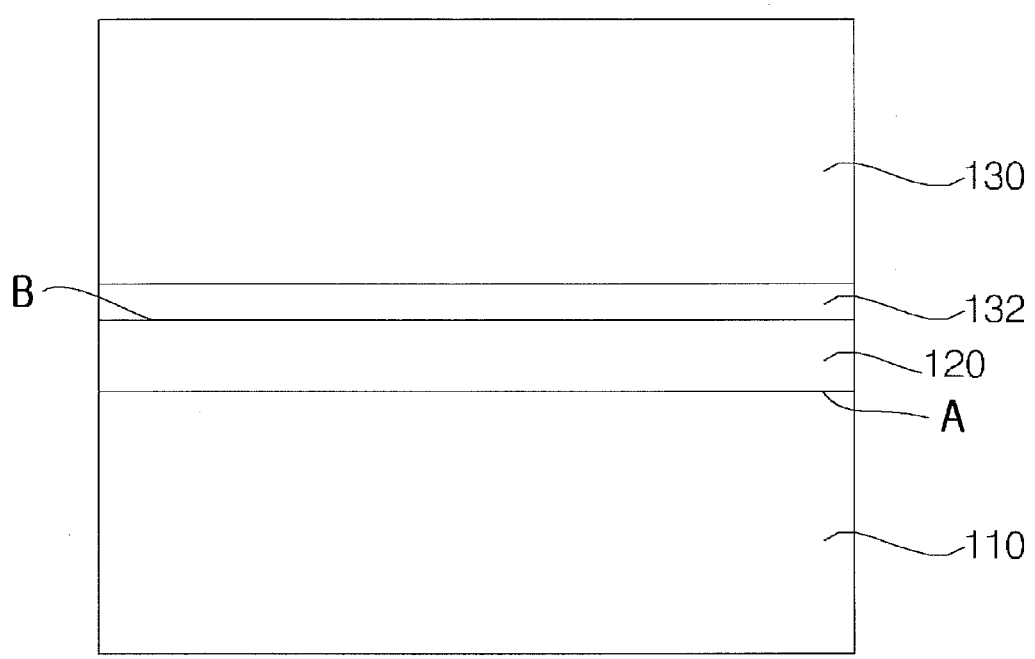

Referring to FIG. 2, a bonding layer 132 may then be formed over the first-conductivity-type semiconductor layer 120. Subsequently, a second substrate 130 is formed over the bonding layer 132.

The bonding layer 132 may have a single-layer structure or a multilayer structure. The bonding layer 132 functions as an adhesive to bond the second substrate 130 to the first-conductivity-type semiconductor layer 120. The bonding layer 132 may also function to prevent the first-conductivity-type semiconductor layer 120 from being damaged. Since the second substrate 130 should be separated in a subsequent process, the bonding layer 132 may be made of a material capable of achieving easy separation.

For example, the bonding layer 132 may be made of a material comprising at least one of $SiO_2$, AuSn, and indium tin oxide (ITO). $SiO_2$ may function to protect the first-conductivity-type semiconductor layer 120 while being capable of achieving easy separation. AuSn may be used for bonding. On the other hand, ITO may be easily separated from the first-conductivity-type semiconductor layer 120, using a laser lift-off (LLO) process, which will be described later. Of course, the above-described materials are only examples. The bonding layer 132 may be made of a single-crystalline, poly-crystalline, or amorphous material combined with nitrogen or oxygen while containing GaN, InGaN, ZnO, InN, $In_2O_3$, $SnO_2$, $Si_3N_4$, BeMgO, MgZnO, or the like. Alternatively, the bonding layer 132 may be made of an Si single-crystalline, poly-crystalline, or amorphous material.

The second substrate 130 may be a single-crystalline, poly-crystalline, or amorphous substrate made of sapphire ($Al_2O_3$), aluminum nitride (AlN), MgO, AlSiC, BN, BeO, $TiO_2$, $SiO_2$, Si, glass, or the like.

Meanwhile, the second substrate 130 functions as a temporary support for the first-conductivity-type semiconductor layer 120. The second substrate 130 is subsequently separated to be reproducible. Bonding between the second substrate 130 and the first-conductivity-type semiconductor layer 120 may be achieved using at least one of Au—Sn eutectic bonding, metallic bonding, spin-on-glass (SOG) bonding, fusion bonding, polymer bonding, anodic bonding, and diffusion bonding. If necessary, the first-conductivity-type semiconductor layer 120 and the second substrate 130 may be directly coupled without using the bonding layer 132. Of course, the present disclosure is not limited to the above-described conditions.

As a die-bonding adhesive, an epoxy-based adhesive containing silver (Ag) exhibiting excellent heat transfer characteristics is most generally used. Low thermal conductivity of an epoxy resin is compensated for through addition of silver powder. Meanwhile, in order to enhance the performance of the epoxy-based adhesive containing silver, carbon nanotubes (CNTs) or carbon nano-fibers (CNFs) may be added. However, even though such an additive is used, there is a limitation in increasing thermal conductivity because the epoxy-based adhesive contains polymers as a major component thereof. To this end, in order to achieve a reduction in thermal resistance, an Au—Sn solder, which is a high-temperature solder material used for inter-metal bonding, is used in place of polymer adhesive. Bonding achieved using an Au—Sn solder is called "Au—Sn eutectic bonding".

Meanwhile, diffusion bonding is a bonding method wherein elements to be bonded, which are spaced apart from each other by a micro-gap, are minimally deformed by heat and pressure, so that contact surfaces thereof are assembled through a diffusion controlled process. Microscopically, the diffusion bonding method is a bonding method wherein two solid-phase atoms migrate to approach an attraction effecting zone, so that they are metal-bonded. Diffusion bonding is carried out mainly in a vacuum atmosphere or an inert gas atmosphere in order to prevent oxidation and to promote diffusion.

Recently, liquid diffusion bonding using an embedded metal having a low melting point has been developed. The above-described diffusion bonding is also called "solid diffusion bonding" so that this diffusion bonding may be distinguished from liquid diffusion bonding.

Solid diffusion bonding methods are classified into a direct bonding method and a bonding method using an embedded metal. The embedded metal is used when degradation in bonding strength occurs due to formation of an inter-metal compound at a bonding layer in a process of bonding different bonding metals (materials) or when it is difficult to generate plastic deformation in a process of bonding high-melting-point metals, so that the boding is achieved using a metal exhibiting rapid oxidation. As the embedded metal, a foil, a plating layer, a deposition layer, or the like may be used.

Figure 3:
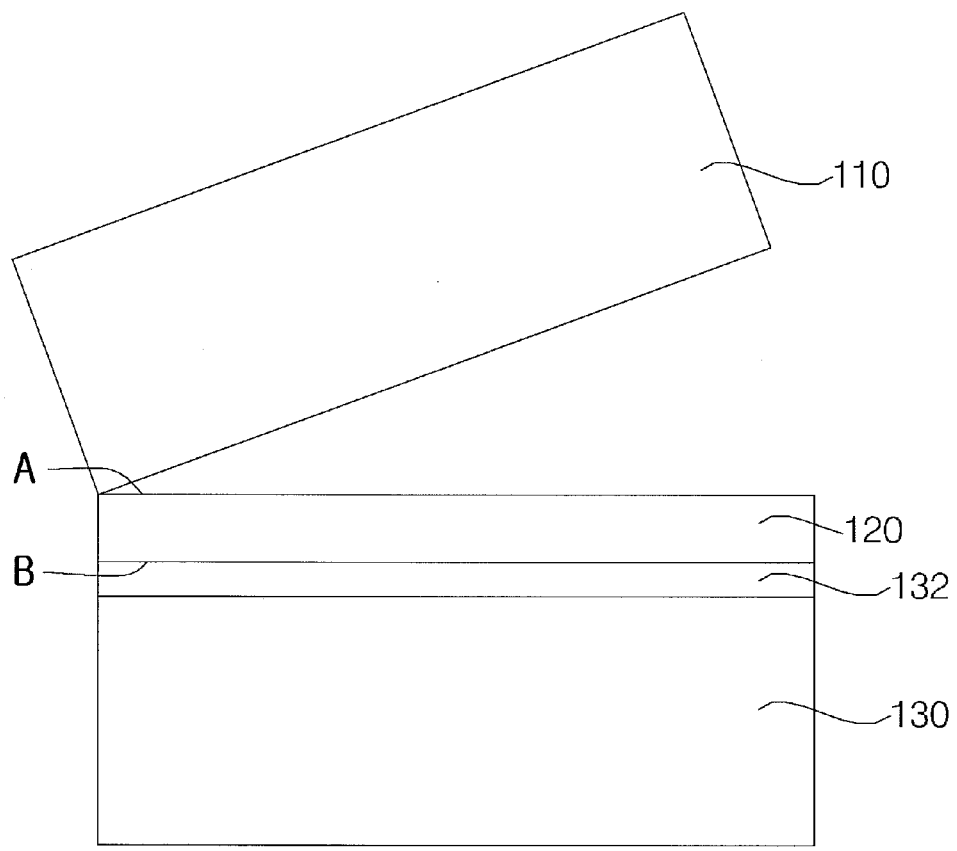

Thereafter, the first substrate 110 may be separated, as shown in FIG. 3. The separation of the first substrate 110 may be achieved using at least one of a laser lift-off method in which a laser beam is irradiated onto a surface of the first substrate 110, a chemical-mechanical polishing method, an electrical-chemical etching method, and a wet etching method using a liquid etchant.

The separation of the first substrate 110 may be carried out, for example, using a laser. For example, a laser lift-off (LLO) process may be used. In the LLO process, for example, a KrF excimer laser beam having a wavelength of 248 nm or an ArF excimer laser beam having a wavelength of 193 nm is irradiated onto an interface between the first substrate 110, which is made of, for example, sapphire, and the first-conductivity-type semiconductor layer 120 through the first substrate 110.

Since light having the above-described wavelength is not absorbed by the sapphire substrate 110, but is absorbed by the first-conductivity-type semiconductor layer 120, for example, the Ga-based semiconductor layer, the laser beam emerging from the sapphire substrate 110 is absorbed to the Ga-based semiconductor layer, thereby rapidly heating the Ga-based semiconductor layer. Then, the heated Ga-based semiconductor layer melts and begins to generate high-temperature and high-pressure surface plasma. Such a plasma generation phenomenon is confined only to the interface between the sapphire substrate and the Ga-based semiconductor layer.

Next, the plasma generated by melting of the Ga-based semiconductor layer rapidly expands into the surroundings. The rapid plasma expansion causes opposite physical forces to be applied to the sapphire substrate and the Ga-based semiconductor layer, respectively. Through this process, the sapphire substrate and Ga-based semiconductor layer are separated from each other.

Figure 4:
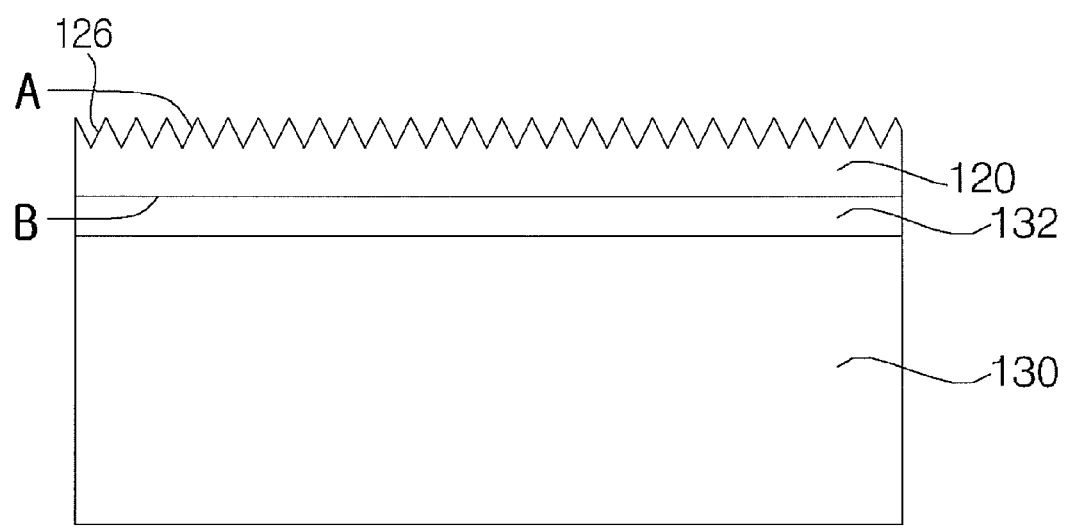

Thereafter, as shown in FIG. 4, irregularities 126 may be formed on a first surface 122 of the first-conductivity-type semiconductor layer 120 exposed in accordance with the separation of the first substrate 110.

The formation of the irregularities 126 may be achieved, for example, using the following method. First, a polymer-based mask layer is formed over a first surface A of the first-conductivity-type semiconductor layer 120. The resultant structure is then subjected to heat treatment to form mask patterns. The polymer-based mask layer may be, formed by dispersing a solution including polymer powder and a dispersing agent over the first surface A through spin coating. As the polymer powder, polyethylene may be used.

When the mask layer is heat-treated, the dispersing agent is volatilized, and the polymer powder remains in a cohered state. As a result, mask patterns having the form of nano-size dots may be formed. The size of the mask patterns is determined in accordance with the grain size of the polymer powder. Thus, it may be possible to form mask patterns uniformly distributed over the first surface A, using polymer powder.

Based on the size and spacing of the mask patterns, the shape, spacing, and size of the irregularities 126, which will be subsequently formed, may be determined. For example, when the size of the mask patterns is reduced, the density of the irregularities 126 may be increase because the area of the region, which absorbs a laser, is reduced.

The first surface A, on which the mask patterns are formed, may be a nitrogen layer. When a laser beam is irradiated onto a surface of the nitrogen layer, the polarity of the nitrogen is changed into the polarity of an element other than nitrogen, for example, the polarity of a Group-III element, thereby forming a surface that is not easily etchable. When the polarity of nitrogen is changed into the polarity of gallium, the region, which has the gallium polarity, is not etched.

After removal of the mask patterns, it may be possible to etch the region other than the region having the gallium polarity.

That is, the first surface 122 of the first-conductivity-type semiconductor layer 120 is defined into etch regions and etch-prevention regions, and is then selectively etched through a chemical etching process using an etching solution, for example, HF, KOH, $H_2PO_4$, or the like. The etching method is not limited to the above-described method. The irregularities 122 formed in accordance with the etching method may have various shapes including a pyramid shape, a hemispherical shape, etc.

The etching depth to form the irregularities 122 may be adjusted by the molarity of the etching solution, the etching temperature, the etching time, etc.

Figure 5:
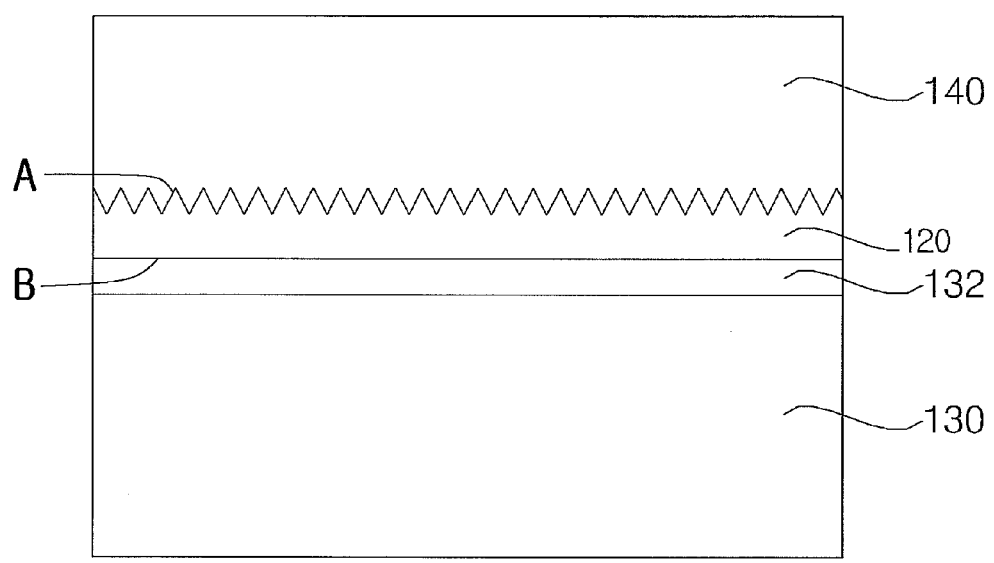

Referring to FIG. 5, a third substrate 140 may then be disposed on the first surface A formed with the irregularities 122. The third substrate 140 may be a single-crystalline, poly-crystalline, or amorphous substrate made of sapphire ($Al_2O_3$), aluminum nitride (AlN), MgO, AlSiC, BN, BeO, $TiO_2$, $SiO_2$, glass, or the like.

That is, as the third substrate 140, a substrate, which is not deformed in a growth temperature environment during growth of a semiconductor layer thereon and is inexpensive, as compared to a sapphire ($Al_2O_3$), may be used.

When the first-conductivity-type semiconductor layer 120, which is coupled to the third substrate 140, is made of a Ga-based semiconductor, the first surface A contacting the third substrate 140 may be an N-face. In this case, an irregularity structure may or may not be formed. A contact layer (not shown) may be further formed between the first-conductivity-type semiconductor layer 120 and the third substrate 140.

The third substrate 140 and the first-conductivity-type semiconductor layer 120 are coupled via the contact layer (not shown). The bonding may be achieved using at least one of Au—Sn eutectic bonding, metallic bonding, SOG bonding, fusion bonding, polymer bonding, anodic bonding, and diffusion bonding.

The contact layer (not shown) may be made of, for example, at least one of $SiO_2$, AuSn, and ITO. $SiO_2$ may function to protect the first-conductivity-type semiconductor layer 120 while being capable of achieving easy separation. AuSn may be used for bonding purpose. Of course, the above-described materials are only examples. The contact layer may be made of a single-crystalline, poly-crystalline, or amorphous material combined with nitrogen or oxygen while containing GaN, InGaN, ZnO, InN, $In_2O_3$, $SnO_2$, $Si_3N_4$, BeMgO, MgZnO, or the like. Alternatively, the contact layer may be made of an Si single-crystalline, poly-crystalline, or amorphous material.

Figure 6:
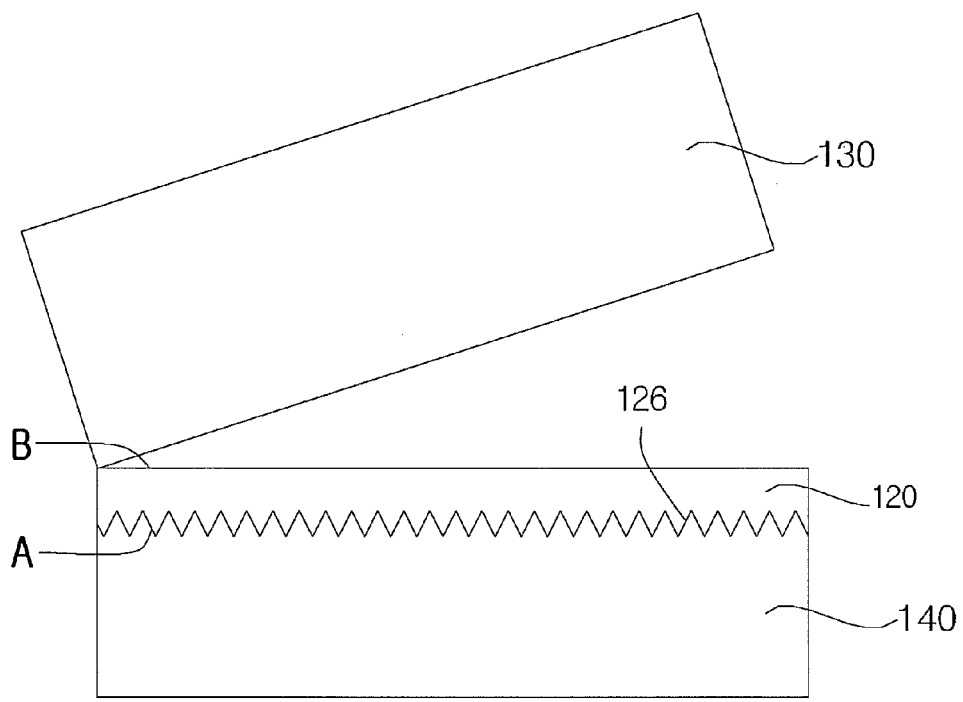
Figure 7:
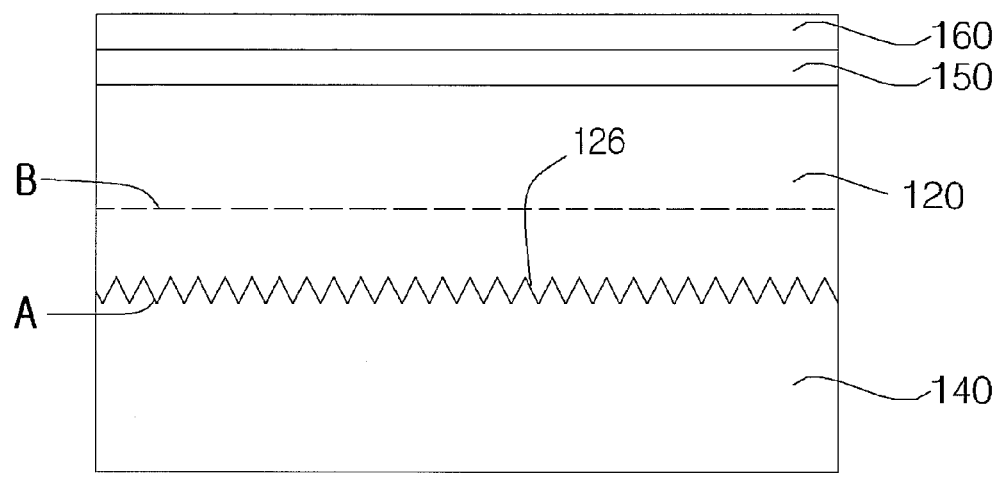

Thereafter, the second substrate 130 may be separated, as shown in FIG. 6. The separation of the second substrate 130 may be achieved using at least one of a laser lift-off method, a chemical-mechanical polishing method, and a wet etching method.

An active layer 150 and a second-conductivity-type semiconductor layer 160 may be formed over the first surface A, from which the second substrate 130. Another first-conductivity-type semiconductor layer may be further formed over the second surface B. Alternatively, the first-conductivity-type semiconductor layer 120 may be further grown over the second surface B, to have an increased thickness. The second surface B, which is exposed in accordance with the separation of the second substrate 130, is a Ga-face, on which the first-conductivity-type semiconductor layer 120 may be easily grown.

The active layer 150 is a region where electrons and holes are recombined. In accordance with recombination of electrons and holes, the active layer 150 transits to a lower energy level, so that it may generate light having a wavelength corresponding to the energy level.

The active layer 150, which may be made of InGaN, may be grown to a thickness of 120 to 1,200 Å by supplying $NH_3$, TMGa, or tri-methyl indium (TMIn) at a growth temperature of 780° C. while using nitrogen as carrier gas. In this case, the active layer 150 may have a multilayer structure having layers with different molarities of elements of InGaN.

The active layer 150 may have one of a single quantum well structure, a multi-quantum well (MQW) structure, a quantum wire structure, and a quantum dot structure. The present embodiment will be described in conjunction with the case in which the active layer 150 has an MQW structure, although the present disclosure is not limited thereto.

In the MQW structure, an increased number of electrons are concentrated at a low-energy-level region in the quantum well layer. As a result, the recombination probability of electrons and holes are increased, so that enhanced light emission effects may be obtained.

When the active layer 150 has a quantum well structure, it may have a single or quantum well structure including a well layer having a formula of $In_xAl_yGa_{1-x-y}N$ ($0 \le x \le 1$, $0 \le y \le 1$, and $0 \le x+y \le 1$) and a barrier layer having formula of $In_aAl_bGa_{1-a-b}N$ ($0 \le a \le 1$, $0 \le b \le 1$, and $0 \le a+b \le 1$). The well layer may be made of a material having a lower bandgap than the barrier layer.

A conductive clad layer (not shown) may be formed over and/or beneath the active layer 144. The conductive clad layer may be made of an AlGaN-based semiconductor. The conductive clad layer may have a wider bandgap than the active layer 144.

A second-conductivity-type semiconductor layer 160 is disposed over the active layer 150.

The second-conductivity-type semiconductor layer 160 may be formed of a p-type GaN layer. It may be possible to combine holes and electrons in the active layer 150 by supplying the holes to the active layer 150 by drive current applied from an outside of the active layer 150. The second-conductivity-type semiconductor layer 160 may be implemented by a p-type semiconductor layer doped with a p-type dopant. The p-type semiconductor layer may be made of a semiconductor material having a formula of $In_xAl_yGa_{1-x-y}N$ ($0 \le x \le 1$, $0 \le y \le 1$, and $0 \le x+y \le 1$), for example, GaN, AlN, AlGaN, InGaN, InN, InAlGaN, or AlInN. The p-type semiconductor layer may be doped with a p-type dopant such as Mg, Zn, Ca, Sr, and Ba.

Irregularities may be formed at a portion or entire portion of the upper surface of the second-conductivity-type semiconductor layer 160 by a certain etching method in order to achieve an enhancement in light extraction efficiency. The formation of the irregularities may be achieved using the same method as described above and, as such, no description thereof will be given.

Meanwhile, a semiconductor layer having an opposite polarity to the second-conductivity-type semiconductor layer 160 may be formed over the second-conductivity-type semiconductor layer 160. That is, when the second-conductivity-type semiconductor layer 160 is a p-type semiconductor layer, an n-type semiconductor layer may be further formed. Also, the first-conductivity-type semiconductor layer 120 may be implemented by a p-type semiconductor layer, and the second-conductivity-type semiconductor layer 160 may be implemented by an n-type semiconductor layer. Thus, the light emitting device according to the illustrated embodiment may have at least one of an n-p junction structure, a p-n junction structure, an n-p-n junction structure, and a p-n-p junction structure.

Since the second surface B, from which the second substrate 130 is separated, is a flat Ga-face, another first-conductivity-type semiconductor layer 120 may be additionally formed over the second surface B. In this case, the active layer 150 and second-conductivity-type semiconductor layer 160 may be grown over the additionally-formed first-conductivity-type semiconductor layer 120.

Another first-conductivity-type semiconductor layer 120 may be additionally formed over the second surface B of the previously-formed first-conductivity-type semiconductor layer 120. In this case, the active layer 150 and second-conductivity-type semiconductor layer 160 may be grown over the additionally-formed first-conductivity-type semiconductor layer 120.

Meanwhile, the above-described first-conductivity-type semiconductor layer 120, active layer 150, and second-conductivity-type semiconductor layer 160 may be formed using metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or a sputtering method. Of course, the formation method is not limited to the above-described methods.

The light emitting device according to the illustrated embodiment may be mounted in a package. Such light emitting device packages are prepared in plural, and are then arrayed on a substrate. Optical members, namely, light guide plates, prism sheets, diffusion sheets, etc., may be arranged on optical paths of the light emitting device packages. The light guide plate, prism sheet, and diffusion sheet may function as a light unit. In accordance with another embodiment, an image display apparatus, an indication apparatus or a lighting system may be implemented using the semiconductor light emitting devices or light emitting device packages described in conjunction with the above-described embodiments. The lighting system may include, for example, a lamp or a street lamp.

Figure 8A:
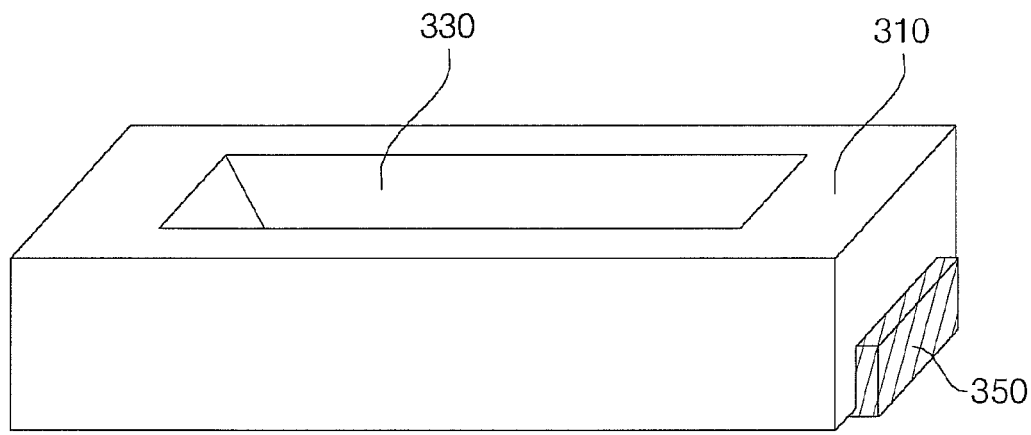
FIG. 8A is a perspective view illustrating a light emitting device package according to an exemplary embodiment.
Figure 8B:
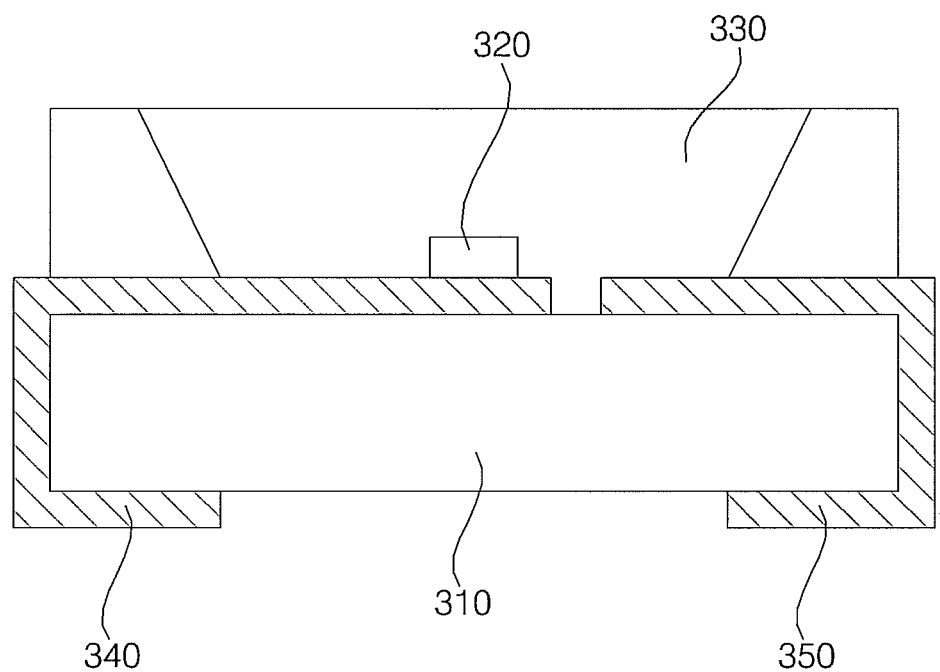
FIG. 8B is a sectional view illustrating a light emitting device package according to another embodiment.

FIG. 8A is a perspective view illustrating a light emitting device package according to an exemplary embodiment. FIG. 8B is a sectional view illustrating a light emitting device package according to another embodiment.

Referring to FIGS. 8A and 8B, the light emitting device package, which is designated by reference numeral "300", may include a body 310 formed with a cavity, first and second electrodes 340 and 350 mounted on the body 310, a light emitting device 320 electrically connected to the first and second electrodes 340 and 350, and an encapsulator 330 formed in the cavity. The encapsulator 330 may contain a fluorescent substance (not shown).

The light emitting device 320 may be a light emitting device manufactured in accordance with the above-described light emitting device manufacturing method.

The body 310 may be made of at least one of a resin material such as polyphthalamide (PPA), silicon (Si), aluminum (Al), aluminum nitride (AlN), liquid crystal polymer such as photo sensitive glass (PSG), polyamide 9T (PA9T), sindiotactic polystyrene (SPS), a metal, sapphire ($Al_2O_3$), beryllium oxide (BeO), and ceramic, or may be a printed circuit board (PCB). The body 310 may be formed by an injection molding process, an etching process or the like, although the present disclosure is not limited thereto.

The body 310 may have an inclined surface at an inner surface thereof. In accordance with the inclination of the inclined surface, the reflection angle of light emitted from the light emitting device 320 may be varied. Thus, the orientation angle of outwardly emitted light may be adjusted.

When viewed from the top side, the cavity, which is formed at the body 310, may have a circular, rectangular, polygonal or elliptical shape. In particular, the cavity may have curved corners. Of course, the cavity is not limited to the above-described shapes.

The encapsulator 330 may fill the cavity, and may include a fluorescent substance (not shown). The encapsulator 330 may be made of transparent silicon, epoxy resin, or other resin materials. The encapsulator 330 may be formed by filling the cavity with an encapsulating material, and curing the filled material using ultraviolet light or heat.

The kind of the fluorescent substance (not shown) may be selected in accordance with the wavelength of light emitted from the light emitting device 320 in order to realize emission of white light.

The fluorescent substance (not shown) contained in the encapsulator 330 may be a blue, bluish green, green, yellowish green, yellow, yellowish red, orange, or red light-emitting fluorescent substance in accordance with the wavelength of light emitted from the light emitting device 320.

That is, the fluorescent substance (not shown) may be excited by light emitted from the light emitting device 320 at a first wavelength, to generate light of a second wavelength. For example, when the light emitting device 320 is a blue light emitting diode, and the fluorescent substance is a yellow fluorescent substance, the yellow fluorescent substance is excited by blue light, thereby emitting yellow light. In this case, the light emitting device package 300 may provide white light as the blue light generated from the blue light emitting diode and the yellow light generated in accordance with the excitation by the blue light are mixed.

Similarly, when the light emitting device 320 is a green light emitting diode, a magenta fluorescent substance or a mixture of blue and red fluorescent substances may be used as the fluorescent substance. Also, when the light emitting device 320 is a red light emitting diode, a cyan fluorescent substance or a mixture of blue and green fluorescent substances may be used as the fluorescent substance.

The fluorescent substance (not shown) may be a known fluorescent substance such as a YAG-based, TAG-based, sulfide-based, silicate-based, aluminate-based, nitride-based, carbide-based, nitridosilicate-based, borate-based, fluoride-based, or phosphate-based fluorescent substance.

Meanwhile, the first and second electrodes 340 and 350 may be mounted on the body 310. The first and second electrodes 340 and 350 may be electrically connected to the light emitting device 320, to supply electric power to the light emitting device 320.

The first and second electrodes 340 and 350 are electrically isolated from each other. The first and second electrodes 340 and 350 may function to reflect light generated from the light emitting device 320, thereby enhancing luminous efficiency. The first and second electrodes 340 and 350 may also outwardly dissipate heat generated from the light emitting device 320.

Although the light emitting device 320 is illustrated as being mounted on the first electrode 340 in FIG. 8B, the present disclosure is not limited thereto. The light emitting device 320, first electrode 340 and second electrode 350 may be electrically connected by one of wire bonding, flip chip bonding, and die bonding.

The first and second electrodes 340 and 350 may be made of at least one of titanium (Ti), copper (Cu), nickel (Ni), gold (Au), chromium (Cr), tantalum (Ta), platinum (Pt), tin (Sn), silver (Ag), phosphor (P), aluminum (Al), indium (In), palladium (Pd), cobalt (Co), silicon (Si), germanium (Ge), hafnium (Hf), ruthenium (Ru), and iron (Fe), or an alloy thereof. The first and second electrodes 340 and 350 may have a single-layer structure or a multilayer structure, although the present disclosure is not limited thereto.

The light emitting device 320 is mounted on the first electrode 340. For example, the light emitting device 320 may be, for example, a light emitting device to emit red, green, blue and white light, or an ultraviolet (UV) light emitting device to emit ultraviolet light, although it is not limited thereto. One or more light emitting devices 320 may be mounted.

The light emitting device 320 may be of a horizontal type in which all electrical terminals are formed on an upper surface of the light emitting device 320, or may be of a vertical type in which the electrical terminals are formed on upper and lower surfaces of the light emitting device 320. Also, the light emitting device 320 may be of a flip-chip type.

The light emitting device package 300 according to the illustrated embodiment may be prepared in plural, and then arrayed on a substrate. Optical members, namely, light guide plates, prism sheets, diffusion sheets, etc., may be arranged on optical paths of the light emitting device packages 300.

The light emitting device packages 300, substrate, and optical members may function as a light unit. In accordance with another embodiment, a display apparatus, an indication apparatus or a lighting system may be implemented using the light emitting devices or light emitting device packages described in conjunction with the above-described embodiments. The lighting system may include, for example, a lamp or a street lamp.

Figure 9A:
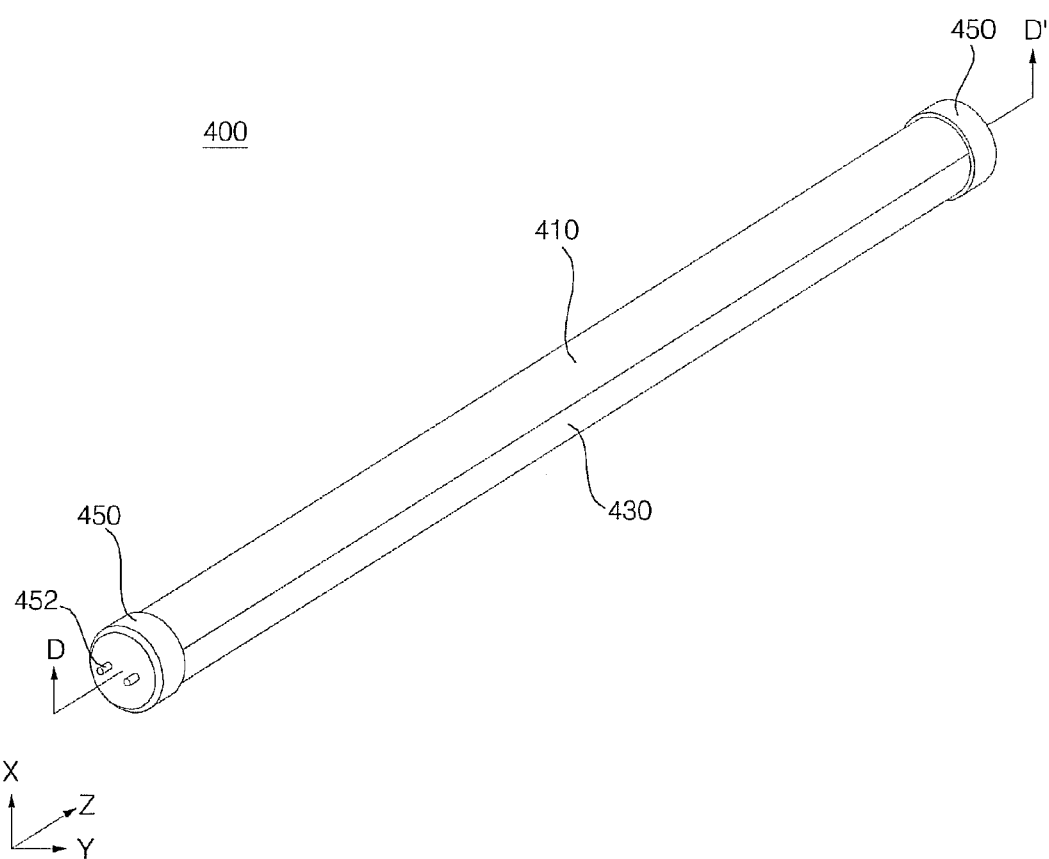
FIG. 9A is a perspective view illustrating a lighting apparatus including a light emitting device according to an exemplary embodiment.
Figure 9B:
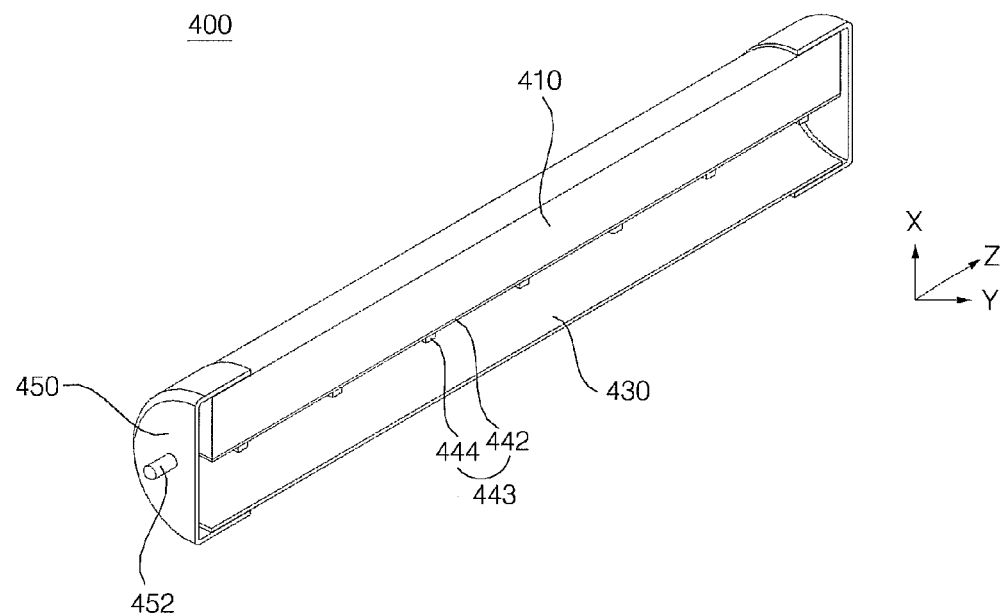
FIG. 9B is a cross-sectional view taken along a line D-D' in FIG. 9A.

FIG. 9A is a perspective view illustrating a lighting apparatus including a light emitting device according to an exemplary embodiment. FIG. 9B is a cross-sectional view taken along a line D-D' in FIG. 9A. In FIG. 9A, the lighting apparatus is designated by reference numeral "400".

FIG. 9B is a cross-sectional view taken along a Z-X plane of the lighting apparatus 400 shown in FIG. 9A, and viewed in a horizontal direction Y. Here, "Z" represents a longitudinal direction, and "X" represents a height direction.

Referring to FIGS. 9A and 9B, the lighting apparatus 400 may include a body 410, a cover 430 coupled to the body 410, and end caps 450 located at both ends of the body 410.

A light emitting device module 440 is coupled to a lower surface of the body 410. The body 410 may be made of a metal material exhibiting excellent conductivity and excellent heat radiation effects to outwardly dissipate heat generated from the light emitting device module 440 through an upper surface of the body 410, although the present disclosure is not limited thereto.

The light emitting device packages 444 may be mounted on a board 442 in multiple rows while having various colors, to form a multi-color array. The light emitting device packages 444 may be mounted at the same distance, or may be mounted at different distances to enable brightness adjustment, if necessary. The board 442 may be a metal core PCB (MCPCB) or a flame retardant-4 (FR4) PCB.

The cover 430 may have a circular shape to surround the lower surface of the body 410, although the present disclosure is not limited thereto.

The cover 430 protects the light emitting device module 440 from external foreign matter, etc. The cover 430 may contain light diffusion particles to achieve anti-glare effects and uniform emission of light generated from the light emitting device packages 444. At least one of the inner and outer surfaces of the cover 430 may be provided with a prism pattern. Also, a fluorescent substance layer may be coated over at least one of the inner and outer surfaces of the cover 430.

Since the light generated from the light emitting device packages 444 is outwardly emitted through the cover 430, the cover 430 should have high light transmittance and heat resistance sufficient to endure heat generated from the light emitting device packages 444. To this end, the cover 430 may be formed of polyethylene terephthalate (PET), polycarbonate (PC) or polymethylmethacrylate (PMMA).

The end caps 450 may be disposed at both ends of the body 410 and function to seal a power supply device (not shown). Each end cap 450 is provided with power pins 452, so that the lighting apparatus 400 in accordance with the illustrated embodiment may be directly connected to a terminal without an additional connector.

Figure 10:
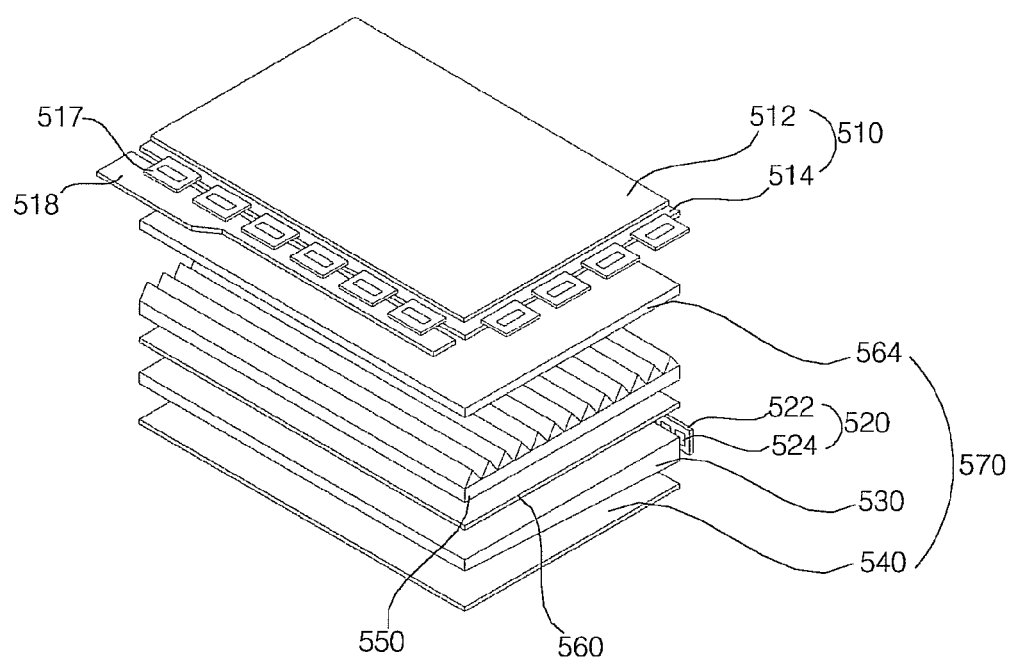
FIG. 10 is an exploded perspective view illustrating a liquid crystal display apparatus including a light emitting device according to an exemplary embodiment.

FIG. 10 is an exploded perspective view illustrating a liquid crystal display apparatus including a light emitting device according to an exemplary embodiment.

FIG. 10 illustrates an edge-light type liquid crystal display apparatus 500. The liquid crystal display apparatus 500 may include a liquid crystal display panel 510 and a backlight unit 570 to supply light to the liquid crystal display panel 510.

The liquid crystal display panel 510 may display an image using the light supplied from the backlight unit 570. The liquid crystal display panel 510 may include a color filter substrate 512 and a thin film transistor substrate 514, which are opposite each other with liquid crystals interposed therebetween.

The color filter substrate 512 may realize the color of an image displayed on the liquid crystal display panel 510.

The thin film transistor substrate 514 is electrically connected to a PCB 518, on which a plurality of circuit elements is mounted, by means of a drive film 517. The thin film transistor substrate 514 may apply drive voltage provided by the PCB 518 to liquid crystals in response to a drive signal transmitted from the PCB 518.

The thin film transistor substrate 514 may include thin film transistors and pixel electrodes in the form of thin films formed on another substrate made of a transparent material such as glass or plastic.

The backlight unit 570 includes a light emitting device module 520 to emit light, a light guide plate 530 to change light emitted from the light emitting device module 520 into planar light and to transmit the planar light to the liquid crystal display panel 510, a plurality of films 550, 560 and 564 to achieve uniformity in brightness distribution and improved vertical incidence of light emerging from the light guide plate 530, and a reflection sheet 540 to reflect light emitted rearwards from the light guide plate 530 toward the light guide plate 530.

The light emitting device module 520 may include a plurality of light emitting device packages 524 and a PCB 522 on which the plurality of light emitting device packages 524 is mounted to form a module.

Each light emitting device package 524 includes a light emitting device (not shown). The light emitting device (not shown) may be a light emitting device manufactured in accordance with the above-described light emitting device manufacturing method.

The backlight unit 570 may include a diffusion film 566 to diffuse light incident thereupon from the light guide plate 530 toward the liquid crystal display panel 510, and a prism film 550 to condense the diffused light so as to enhance vertical light incidence. The backlight unit 570 may further include a protection film 564 to protect the prism film 550.

Figure 11:
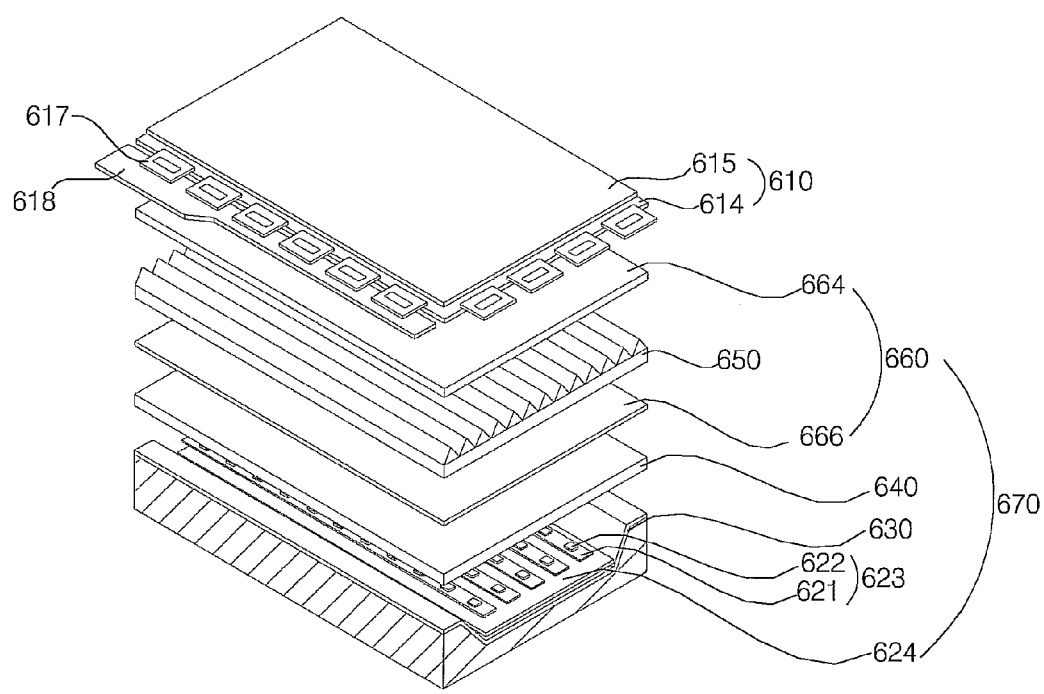
FIG. 11 is an exploded perspective view illustrating a liquid crystal display apparatus including a light emitting device according to another embodiment.

FIG. 11 is an exploded perspective view illustrating a liquid crystal display apparatus including a light emitting device according to another embodiment. The same configuration as that illustrated in FIG. 10 and described with reference to FIG. 10 will not be repeatedly described in detail.

FIG. 11 illustrates a direct type liquid crystal display apparatus 600 including a liquid crystal display panel 610 and a backlight unit 670 to supply light to the liquid crystal display panel 610. The liquid crystal display panel 610 is identical to that of FIG. 10 and, as such, no detailed description thereof will be given.

The backlight unit 670 may include a plurality of light emitting device modules 623, a reflection sheet 624, a lower chassis 630 in which the light emitting device modules 623 and reflection sheet 624 are accommodated, and a diffusion sheet 640 and a plurality of optical films 660, which are disposed over the light emitting device modules 623.

Each light emitting device module 623 may include a plurality of light emitting device packages 622, and a PCB 621 on which the plurality of light emitting device packages 622 is mounted to form a module.

Each light emitting device package 622 includes a light emitting device (not shown). The light emitting device (not shown) may be a light emitting device manufactured in accordance with the above-described light emitting device manufacturing method.

The reflection sheet 624 reflects light generated by the light emitting device packages 622 toward the liquid crystal display panel 610, to achieve an enhancement in light utilization efficiency.

Meanwhile, the light generated from the light emitting device modules 623 is incident upon the diffusion sheet 640. The optical films 660 are disposed over the diffusion sheet 640. The optical films 660 may include a diffusion film 666, a prism film 650 and a protection film 664.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A method for manufacturing a light emitting device, comprising:
    forming a first-conductivity-type semiconductor layer comprising doped GaN over a first substrate such that a first surface of the first-conductivity-type semiconductor layer is adjacent to the first substrate;
    disposing a second substrate on a second surface of the first-conductivity-type semiconductor layer opposite the first surface;
    separating the first substrate;
    disposing a third substrate on the first surface;
    separating the second substrate;
    further growing the first-conductivity-type semiconductor layer comprising doped GaN over the second surface that is separated from the second substrate, to increase a thickness of the first-conductivity-type semiconductor layer; and
    forming an active layer and a second-conductivity-type semiconductor layer over the second surface that is a Ga-face.

2. The method according to claim 1, further comprising:
    further growing the first-conductivity-type semiconductor layer over the second surface, to increase a thickness of the first-conductivity-type semiconductor layer.

3. The method according to claim 1, wherein the first substrate comprises one of sapphire ($Al_2O_3$), GaN, and SiC.

4. The method according to claim 1, wherein the second substrate comprises at least one of glass and silicon (Si).

5. The method according to claim 1, wherein the third substrate comprises at least one of glass and silicon (Si).

6. The method according to claim 1, further comprising:
    forming a bonding layer between the second surface and the second substrate.

7. The method according to claim 6, wherein the bonding layer comprises at least one of $SiO_2$, gold-tin (AuSn), indium tin oxide (ITO), GaN, InGaN, ZnO, InN, $In_2O_3$, $SnO_2$, $Si_3N_4$, BeMgO, and MgZnO.

8. The method according to claim 6, wherein the first substrate is separated from the first-conductivity-type semiconductor layer, using at least one of a laser lift off method, a chemical-mechanical polishing method, an electrical-chemical etching method, and a wet etching method using a liquid etchant.

9. The method according to claim 6, wherein the second substrate is separated from the first-conductivity-type semiconductor layer, using at least one of a laser lift off method, a chemical-mechanical polishing method, an electrical-chemical etching method, and a wet etching method using a liquid etchant.

10. The method according to claim 6, wherein the bonding layer is coupled to the second substrate, using at least one of Au—Sn eutectic bonding, metallic bonding, spin-on-glass (SOG) bonding, fusion bonding, polymer bonding, anodic bonding, and diffusion bonding.

11. The method according to claim 1, wherein the third substrate is coupled to the first-conductivity-type semiconductor layer, using at least one of Au—Sn eutectic bonding, metallic bonding, spin-on-glass (SOG) bonding, fusion bonding, polymer bonding, anodic bonding, and diffusion bonding.

12. The method according to claim 1, further comprising:
    forming irregularities on the first surface, which is exposed after the separation of the first substrate.

13. The method according to claim 1, further comprising:
    forming an undoped semiconductor layer over the first-conductivity-type semiconductor layer.

14. The method according to claim 1, further comprising:
    forming a contact layer over the first surface, which is exposed after the separation of the first substrate.

15. The method according to claim 14, wherein the contact layer comprises at least one of $SiO_2$, gold-tin (AuSn), indium tin oxide (ITO), GaN, InGaN, ZnO, InN, $In_2O_3$, $SnO_2$, $Si_3N_4$, BeMgO, and MgZnO.

16. The method according to claim 1, further comprising:
  forming a buffer layer between the first substrate and the first-conductivity-type semiconductor layer.

* * * * *